US012804935B2

(12) United States Patent
Mrinal et al.

(10) Patent No.: US 12,804,935 B2
(45) Date of Patent: Nov. 17, 2026

(54) METHOD OF MANUFACTURING METHOD A SEMICONDUCTOR DEVICE WITH DIFFERENT TRENCH AND POLY SIZES, A SEMICONDUCTOR DEVICE MANUFACTURED USING THIS METHOD AND A MOSFET DEVICE MANUFACTURED ACCORDING TO THE METHOD

(71) Applicant: NEXPERIA B.V., Nijmegen (NL)

(72) Inventors: Aryadeep Mrinal, Hamburg (DE); Kilian Ong, Hamburg (DE); Dnyanesh Havaldar, Manchester (GB)

(73) Assignee: NEXPERIA B.V., Nijmegen (NL)

( * ) Notice: Subject to any disclaimer, the term of this patent is extended or adjusted under 35 U.S.C. 154(b) by 327 days.

(21) Appl. No.: 18/511,432

(22) Filed: Nov. 16, 2023

(65) Prior Publication Data

US 2024/0162334 A1 May 16, 2024

(30) Foreign Application Priority Data

Nov. 16, 2022 (EP) .................................... 22207849

(51) Int. Cl.

*H10D 30/01* (2025.01)
*H10D 30/66* (2025.01)
*H10D 64/00* (2025.01)
*H10D 64/01* (2025.01)

(52) U.S. Cl.

CPC ....... *H10D 30/0297* (2025.01); *H10D 30/668* (2025.01); *H10D 64/01* (2025.01); *H10D 64/117* (2025.01)

(58) Field of Classification Search

CPC .. H10D 30/0297; H10D 30/668; H10D 64/01; H10D 64/117; H10D 64/518; H10D 30/60; H10D 62/113; H10D 62/116; H10D 64/256; H10D 64/513; H10D 30/021

See application file for complete search history.

(56) References Cited

U.S. PATENT DOCUMENTS

| | | | | |
|---|---|---|---|---|
| 5,998,833 | A * | 12/1999 | Baliga | H10D 30/665 257/E27.06 |
| 7,183,610 | B2 | 2/2007 | Pattanayak et al. | |
| 7,638,841 | B2 | 12/2009 | Challa | |
| 7,936,011 | B2 | 5/2011 | Bhalla et al. | |
| 8,269,282 | B2 | 9/2012 | Wood et al. | |
| 8,319,278 | B1 * | 11/2012 | Zeng | H10D 30/665 257/341 |
| 8,482,061 | B2 * | 7/2013 | Nishimura | H10D 12/031 257/77 |

(Continued)

*Primary Examiner* — Caleb E Henry

(74) *Attorney, Agent, or Firm* — Ruggiero McAllister McMahon LLC

(57) ABSTRACT

A method of manufacturing a semiconductor trench-gate semiconductor device is provided, that includes a trench divided into a first trench and a second trench and the source poly is arranged in the second trench and a gate poly is arranged in the first trench and separated from the source poly by means of an inter poly oxide layer. The width of the second trench is larger than the width of the first trench and the depth of the second trench is larger than the depth of the first trench and the liner oxide layer is thicker than the gate oxide layer. Also, the ratio between the first trench width A and the second trench width B is in a range from 1:1.7 to 1:2.

18 Claims, 5 Drawing Sheets

(56) References Cited

U.S. PATENT DOCUMENTS

| | | | | |
|---|---|---|---|---|
| 8,564,051 | B2 * | 10/2013 | Ma | H10D 30/665 257/341 |
| 8,592,895 | B2 * | 11/2013 | Yilmaz | H10D 30/668 438/270 |
| 8,618,601 | B2 * | 12/2013 | Chen | H10D 30/025 257/330 |
| 9,048,215 | B2 * | 6/2015 | Asahara | H10D 64/518 |
| 9,741,825 | B1 * | 8/2017 | Tsai | H10D 30/025 |
| 9,905,690 | B1 | 2/2018 | Tsai et al. | |
| 10,361,298 | B2 * | 7/2019 | Fukunaga | H10D 30/0295 |
| 10,714,574 | B2 * | 7/2020 | Yilmaz | H10D 12/038 |
| 12,295,166 | B2 * | 5/2025 | Bobde | H10D 84/0144 |
| 2006/0273386 | A1 * | 12/2006 | Yilmaz | H10D 30/668 257/E21.345 |
| 2009/0272982 | A1 * | 11/2009 | Nakamura | H10D 30/668 257/77 |
| 2011/0254088 | A1 * | 10/2011 | Darwish | H10D 30/0295 257/341 |
| 2015/0295080 | A1 * | 10/2015 | Lee | H10D 30/0295 438/270 |
| 2016/0099351 | A1 * | 4/2016 | Hébert | H10D 30/025 438/587 |
| 2019/0348510 | A1 * | 11/2019 | Yilmaz | H10D 62/393 |
| 2020/0105874 | A1 * | 4/2020 | Yilmaz | H10D 12/038 |
| 2021/0126125 | A1 * | 4/2021 | Grote | H10D 30/665 |
| 2021/0151596 | A1 * | 5/2021 | Chuang | H10D 30/0295 |
| 2021/0175339 | A1 | 6/2021 | Inokuchi et al. | |
| 2022/0302303 | A1 * | 9/2022 | Shin | H10D 30/0297 |
| 2023/0238440 | A1 * | 7/2023 | Bobde | H10D 64/117 257/330 |
| 2023/0282714 | A1 * | 9/2023 | Chang | H10D 64/117 257/330 |

* cited by examiner

METHOD OF MANUFACTURING METHOD A SEMICONDUCTOR DEVICE WITH DIFFERENT TRENCH AND POLY SIZES, A SEMICONDUCTOR DEVICE MANUFACTURED USING THIS METHOD AND A MOSFET DEVICE MANUFACTURED ACCORDING TO THE METHOD

CROSS-REFERENCE TO RELATED APPLICATIONS

This application claims the benefit under 35 U.S.C. § 119(a) of European Application No. 22207849.5 filed Nov. 16, 2022, the contents of which are incorporated by reference herein in their entirety.

BACKGROUND

1. Field of the Disclosure

The present disclosure relates to a method of manufacturing a semiconductor device. The disclosure also pertains to a semiconductor device manufactured using this method and a MOSFET device manufactured according to the method.

2. Description of the Related Art

A known semiconductor device is disclosed in prior art patent document U.S. Pat. No. 8,269,282 B2. The known device includes at least one field effect transistor disposed along a trench in a semiconductor region. The semiconductor region has at least one locally delimited dopant region. The at least one locally delimited dopant region extends from or over a PN-junction between the source region and the body region of the transistor or between the drain region and the body region of the transistor into the body region as far as the gate electrode, such that a gap between the PN-junction and the gate electrode in the body region is bridged by the locally delimited dopant region. The second (lower) trench is thinner than the upper trench.

From U.S. Pat. No. 9,905,690 B1 a semiconductor device is disclosed, wherein a field effect transistor is manufactured by firstly forming an epitaxial layer on a substrate. Subsequently, a trench having an oxide layer is formed on the epitaxial layer. The oxide layer has a first electrode portion with a first width and a first height and a second electrode portion with a second width and a second height. A gate oxide layer covering the oxide layer and the second electrode portion has a gate portion having a third width. The epitaxial layer has a body region and a source region, where these two regions are adjacent to the gate portion and covered by an interlayer dielectric. A source electrode covering the body region and the interlayer dielectric contacts the source region. The first height is no less than the second height, and the first width is smaller than the second width, and the second width is smaller than the third width.

U.S. Pat. No. 7,183,610 B2 discloses a trench MOSFET, in which the lower portion of the trench contains a buried source electrode, which is insulated from the epitaxial layer and semiconductor substrate but in electrical contact with the source region.

US 2021/175339 A1 discloses a semiconductor device with first, and second conductive members, first, second, and third semiconductor regions, and wherein the first semiconductor region includes first and second partial regions and wherein the first conductive member is between the first partial region and the second conductive member and the insulating part includes a first insulating region, a second insulating region, and a third insulating region.

U.S. Pat. No. 7,638,841 B2 discloses a semiconductor device comprising a drift region of a first conductivity type, a well region extending above the drift region and having a second conductivity type opposite the first conductivity type, an active trench extending through the well region and into the drift region, the active trench having its sidewalls and bottom lined with dielectric material, and substantially filled with a first conductive layer and a first gate conductive layer, the first conductive layer being disposed below the first gate conductive layer and separated therefrom by inter-electrode dielectric material, source regions having the first conductivity type formed in the well region adjacent the active trench; and a first Schottky structure formed on a first mesa between two adjacent trenches.

US 2021/126125 A1 discloses a transistor device with a substrate, a first current-carrying region having a first lateral width, and a second current-carrying region, with a first trench being formed between the first current-carrying region and the second current-carrying region and wherein the first trench includes a first vertical component sidewall coupled to the first current-carrying region and a second vertical component sidewall coupled to the second current-carrying region.

U.S. Pat. No. 7,936,011 B2 discloses a semiconductor power device including a plurality of power transistor cells surrounded by a trench opened in a semiconductor substrate, with at least one of the cells constituting an active cell has a source region disposed next to a trenched gate electrically connecting to a gate pad and surrounding the cell and wherein the trenched gate further has a bottom-shielding electrode filled with a gate material disposed below and insulated from the trenched gate.

The prior art suffer from process limitations of minimum contact CD with its control over misalignment and the silicon etch aspect ratio, which limits the performance of a split gate trench MOSFET with respect to low RDSON capabilities at respective reverse breakdown voltages. Accordingly, it is a goal of the present disclosure to provide an improved semiconductor device with an improved reverse breakdown voltage to On-state resistance capabilities.

SUMMARY

According to a first example of the disclosure, a method of manufacturing a trench-gate semiconductor device is proposed, with the method comprising the steps of:

a) providing an epitaxial, EPI, layer with a substrate having seal layer for preventing auto doping from doped substrate region.
b) growing a hard mask, HDM, layer;
c) forming a first opening in the hard mask, HDM;
d) dry etching a first trench from top side towards the bottom side of in vertical direction;
e) forming an oxide layer on the first trench walls;
f) depositing a nitride layer on the oxide layer on the at least first trench walls;
g) forming a nitride spacer from nitride;
h) dielectric etching of the bottom of the first trench to expose the epitaxial, EPI, layer of the first trench;
i) etching a second trench from the bottom side of the first trench towards the bottom side in vertical direction and in horizontal direction;
j) removal of the nitride spacer and the oxide layer;

k) sacrificial oxide growth on the sidewalls of the first trench and/or the second trench to reduces the etch defects;

l) first trench and second trench sidewall oxidation and/or dielectric deposition to create liner oxide layer for the source poly in at least the second trench;

m) source poly deposition in at least second trench;

n) etching the source poly until the source poly will not extend over the second trench;

o) cleaning the first trench side walls by removal of any oxide layers;

p) inter poly oxide, IPO, formation by dielectric deposition or by thermal oxidation;

q) cleaning the first trench side walls;

r) gate oxidation (GOX) on the sidewalls of the first trench;

s) gate poly formation by deposition of poly;

t) etching back the poly;

u) forming a P-body implant and a source implant and contacts, wherein, in the step h), the etching step is executed in vertical direction and in horizontal direction such that the second trench is wider than the first trench and the second trench depth is larger than the first trench depth and the liner oxide layer is thicker than the gate oxide layer.

Instead of etching a single trench at once, the trench etching is done in two steps, first is with any hard mask and second with the nitride oxide spacer formed on side wall of the first trench. The width of both the first trench and the second trench is different, with the second trench being wider than the first trench. The width of the second trench is controlled by the isotropic etching step with undercuts. The wider second trench provides a more narrow silicon region between adjacent trenches.

Additionally in step i) anisotropic etching is applied, optionally in combination with isotropic etching.

Additionally in step f) of depositing said nitride layer and/or step g) forming nitride spacer comprises depositing silicon nitride.

Additionally, the method comprises using a reactive ion etch process.

Additionally, the step g) of forming the nitride spacer comprises the step of dry etching the nitride layer of the bottom part of the first trench, optionally the etching is performed anisotropic. Optionally, in an example, in the step g) oxide etching is applied.

Additionally, the step l) comprises oxidation of the first trench and the second trench and/or deposition of oxide or deposition of oxide with thermal annealing. In particular, according to the disclosure, any step from a) to u) comprises a thermal annealing step.

In a preferred example of the method according to the disclosure, the step h) is carried out until a ratio between the first trench width (A) to the second trench width (B) is in range from 1:1.7 to 1:2.

The disclosure also relates to a semiconductor trench-gate semiconductor device comprising a trench divided into a first trench and a second trench and wherein the source poly is arranged in the second trench and a gate poly is arranged in the first trench and separated from the source poly by an inter poly oxide layer. According to the disclosure the width of the second trench is larger than the width of the first trench and the depth of the second trench is larger than the depth of the first trench and the liner oxide layer is thicker than the gate oxide layer.

Additionally, the ratio between the first trench width (A) to the second trench width (B) is in range from 1:1.7 to 1:2.

Additionally, the ratio between the source poly width (D) to the gate poly width (C) is in the range from 0.7:1 to 1.2:1.

The disclosure also relates to a MOSFET device manufactured using the method according to the disclosure, the MOSFET device according to the disclosure having the technical features disclosed as above.

BRIEF DESCRIPTION OF DRAWINGS

The disclosure will now be discussed with reference to the drawings, which show in.

DETAILED DESCRIPTION

Figure 1:
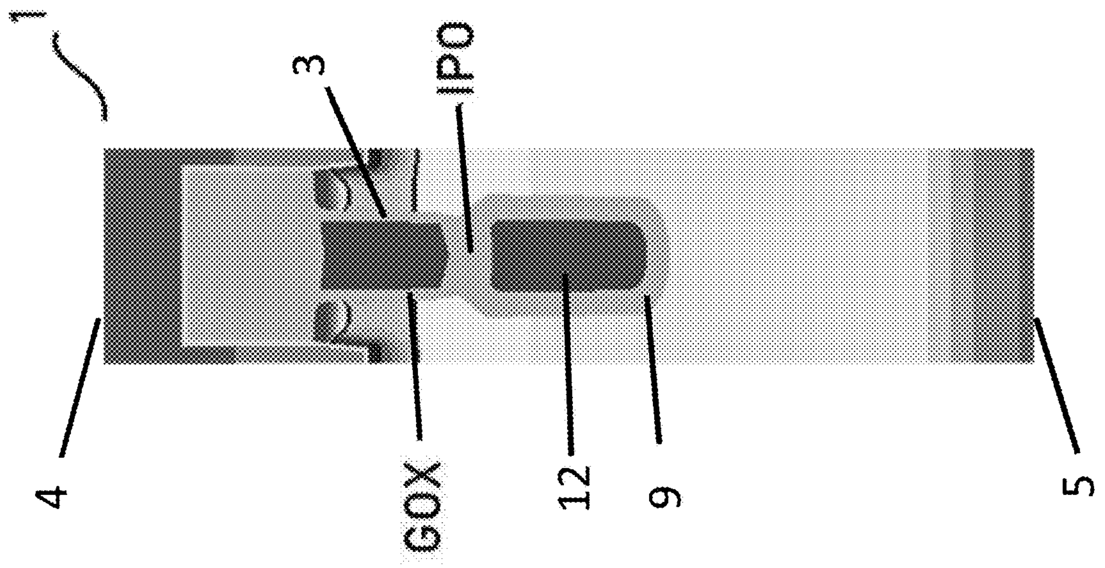
FIG. 1 a schematic cross section of an example of a semiconductor device manufactured with the method according to the disclosure.

For a proper understanding of the disclosure, in the detailed description below corresponding elements or parts of the disclosure will be denoted with identical reference numerals in the drawings.

According to the first example of the disclosure, a method for manufacturing a trench-gate semiconductor device (denoted with reference numeral 1) is proposed. Reference is made to the FIGS. 2-5 which depict the several steps annotated with steps a) till u).

Figure 2:
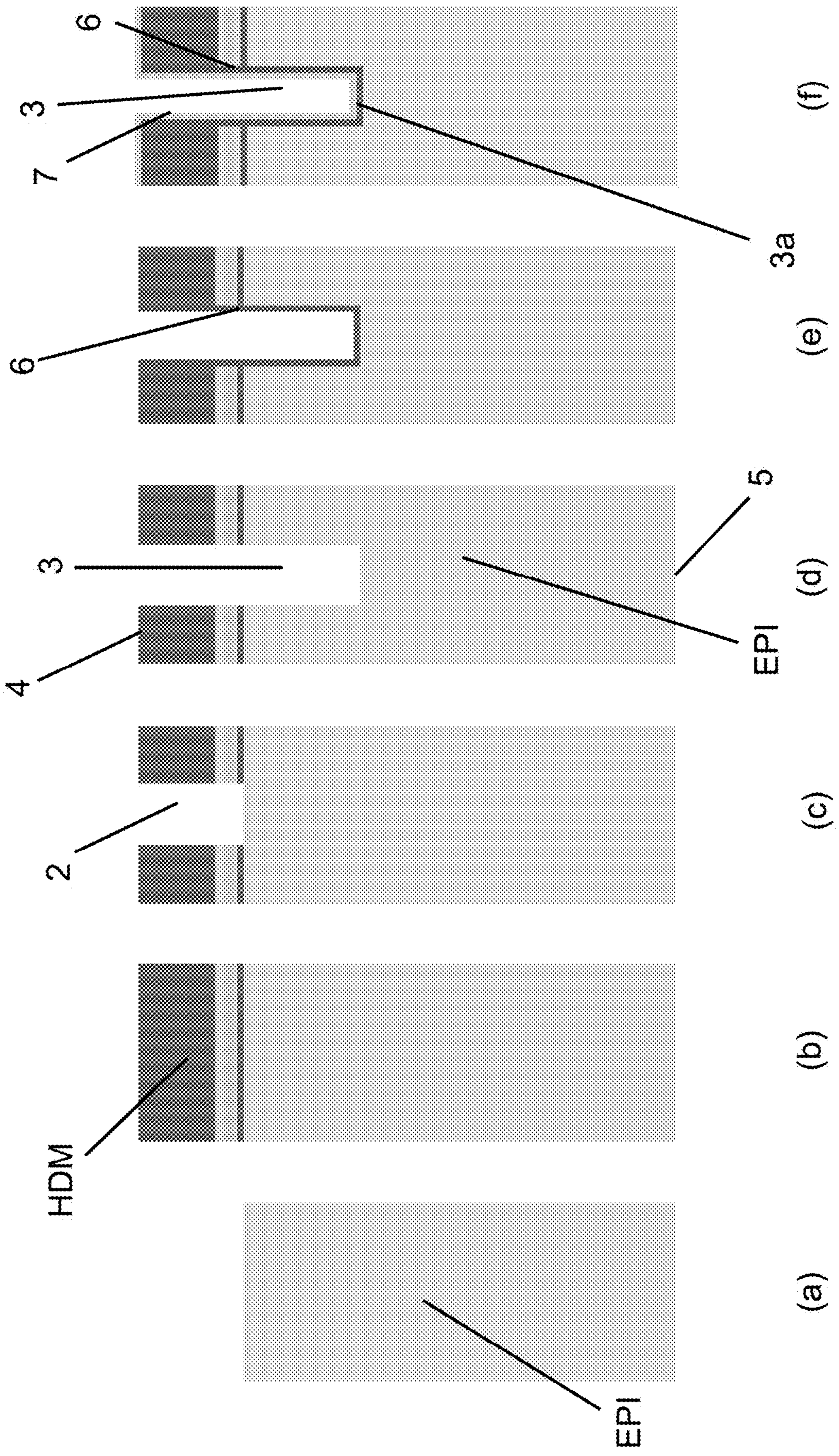
FIG. 2 a schematic view of the manufacturing method according to the disclosure (steps a to f).
Figure 3:
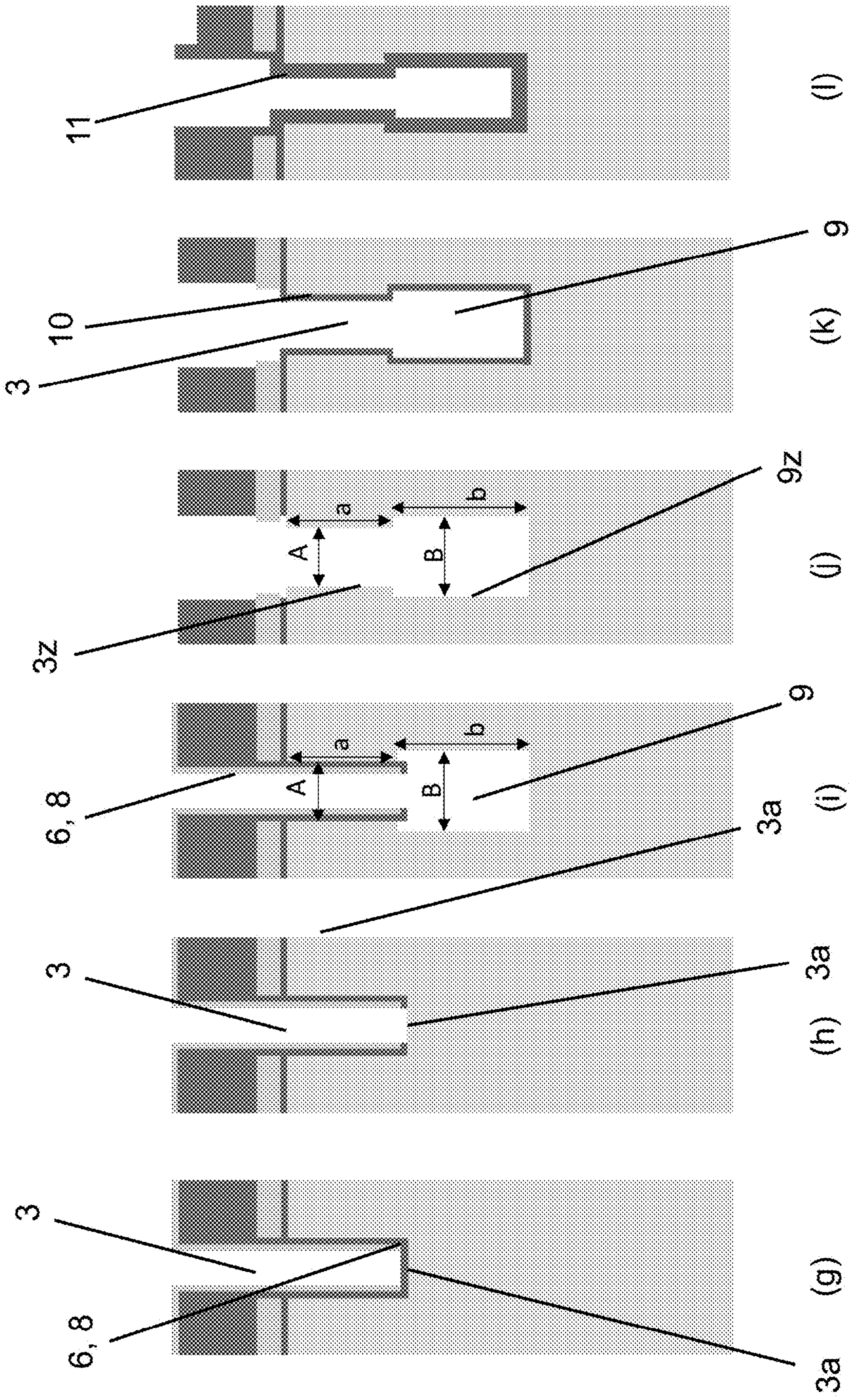
FIG. 3 a schematic view of the manufacturing method according to the disclosure (steps g to l).
Figure 4:
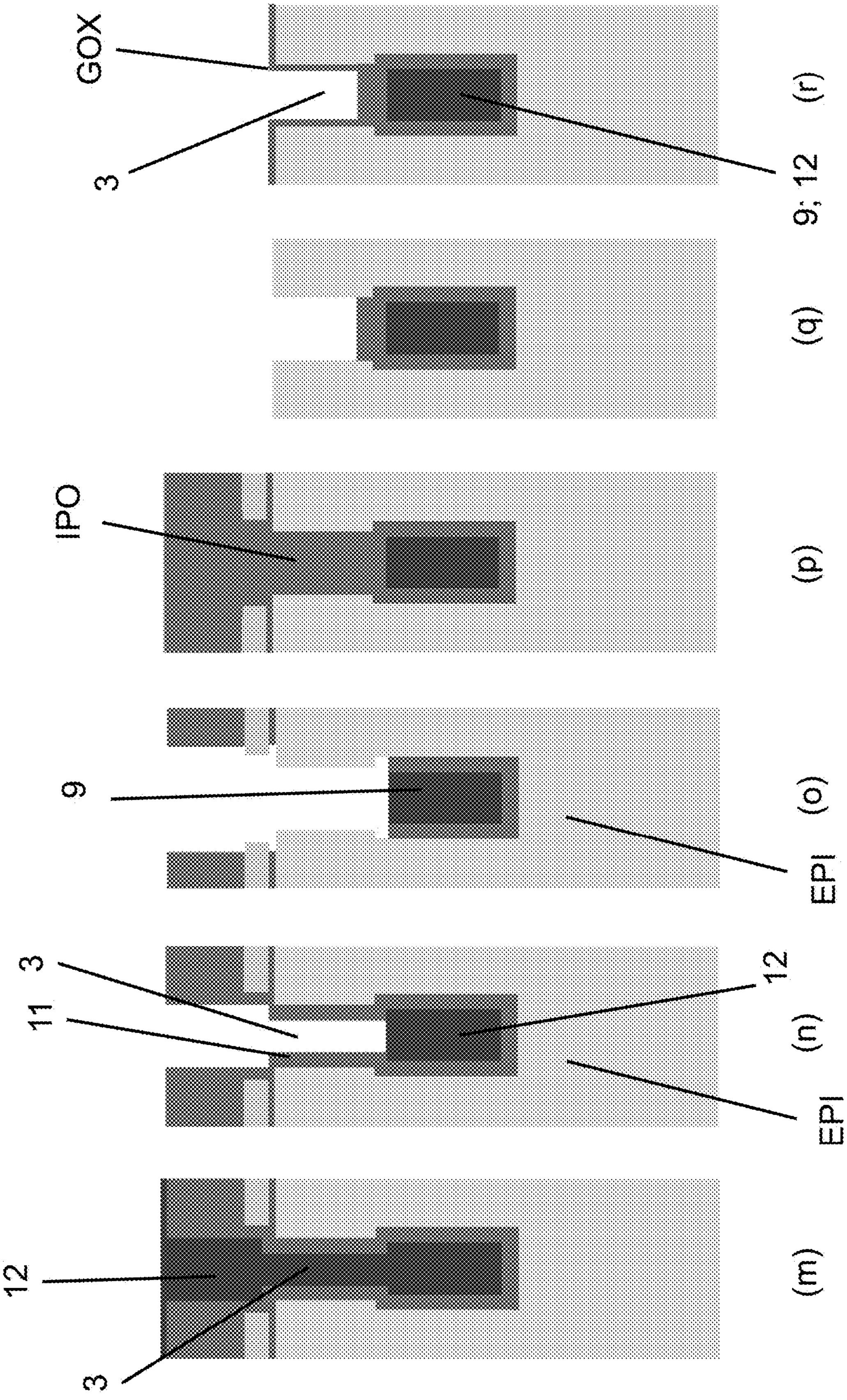
FIG. 4 a schematic view of the manufacturing method according to the disclosure (steps m to r).
Figure 5:
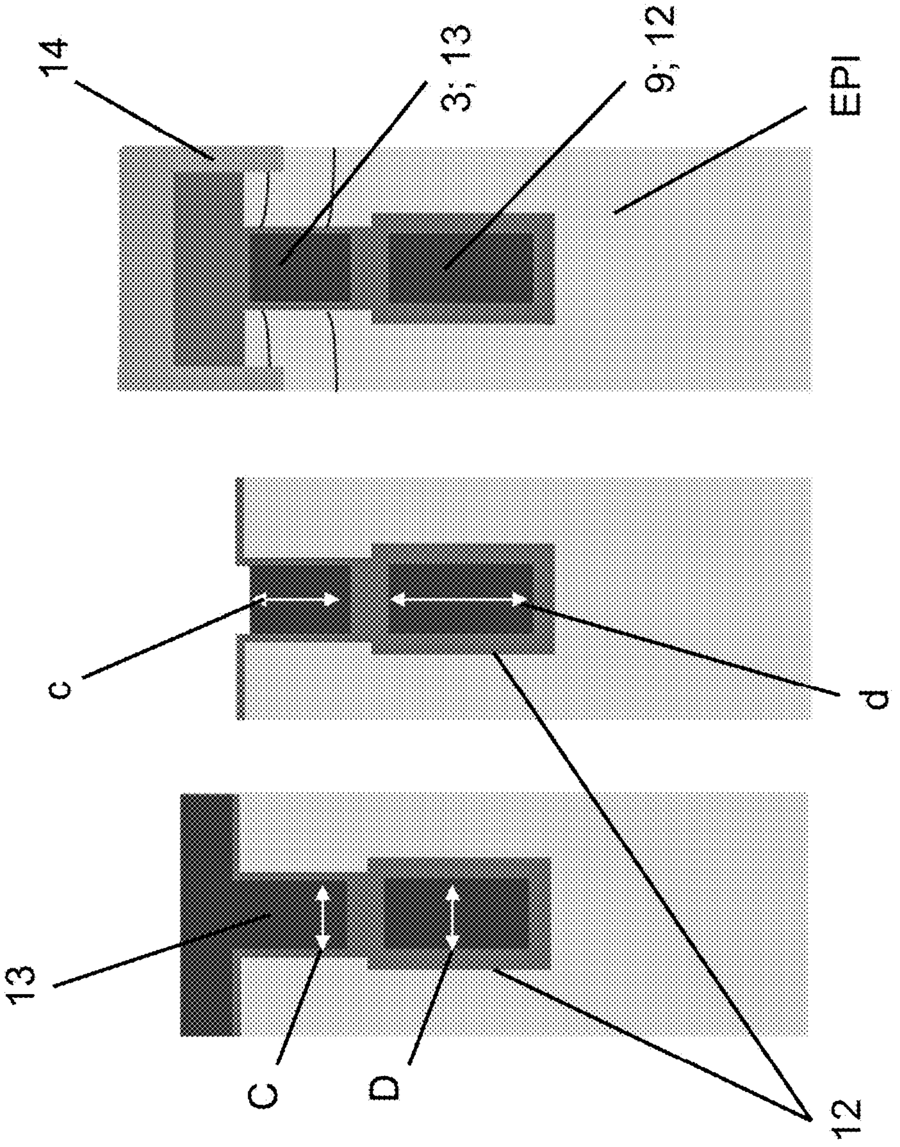
FIG. 5 a schematic view of the manufacturing method according to the disclosure (steps s to u).

A first step is directed in providing an epitaxial (EPI) layer with a substrate having a seal layer for preventing auto doping from doped substrate region, see FIG. 2 step a), b) and c). The epitaxial (EPI) layer has a first or bottom layer side 5 and a second or top layer side 4. A hard mask (HDM) layer is deposited on the top layer side 4 of the epitaxial (EPI) layer.

A hard mask (HDM) is a material used in semiconductor processing as an etch mask instead of a polymer or other organic “soft” resist material. Hard masks are necessary when the material being etched is itself an organic polymer. Anything used to etch this material will also etch the photoresist being used to define its patterning since that is also an organic polymer. This arises, for instance, in the patterning of low-κ dielectric insulation layers used in VLSI fabrication.

Polymers tend to be etched easily by oxygen, fluorine, chlorine, and other reactive gases used in plasma etching. First, the hard mask material is deposited and etched into the required pattern using a standard photoresist process. Following that step, the underlying material can be etched through the hard mask. Finally the hard mask is removed with a further etching process. Hard mask materials can be metal or dielectric.

Silicon based masks such as silicon dioxide or silicon carbide are usually used for etching low-κ dielectrics. However, SiOCH (carbon doped hydrogenated silicon oxide), a material used to insulate copper interconnects, requires an etchant that attacks silicon compounds. For this material, metal or amorphous carbon hard masks are used. The most common metal for hard masks is titanium nitride, but tantalum nitride has also been used.

In the next step (as depicted in FIG. 2*d*) a dry etching step is performed in a vertical direction thus forming a first trench 3 from the top layer side 4 towards the bottom layer side 5 of EPI layer (EPI). Dry etching refers to the removal of material, typically a masked pattern of semiconductor material, by exposing the material to a bombardment of ions (usually a plasma of reactive gases such as fluorocarbons, oxygen, chlorine, boron trichloride; sometimes with addition of nitrogen, argon, helium, and other gases) that dislodge portions of the material from the exposed surface. A common type of dry etching is reactive-ion etching. Unlike with many (but not all, see isotropic etching) of the wet chemical etchants used in wet etching, the dry etching process typically etches directionally (isotopically) or anisotropically.

In the next step (FIG. 2*e*) an oxide layer 6 is formed on the inner walls 3*z* of the first trench 3. This oxide forming step is followed by depositing a nitride layer 7 on the oxide layer 6 formed on the inner walls 3*z* of at least the first trench 3 (shown in FIG. 2*f*).

The next step of the method according to the disclosure requires the formulation of a nitride spacer 8 from the nitride 7 (e.g. silicon nitride), see FIG. 3*g*, within the first trench 3, which step is followed by the step of dielectric etching of the bottom 3*a* of the first trench 3 to expose the epitaxial (EPI) layer of first trench 3 (see the removed part of the nitride spacer 8 on the bottom 3*a* in FIG. 3*h*).

This step exposes the epitaxial layer EPI at the bottom 3*a* of the first trench 3 allowing a further etching step and the manufacturing or forming of a second trench 9. The second trench 9 is formed by etching starting from the bottom side 3*a* of the first trench 3 towards the bottom layer side 5 of the EPI layer, as well as in both directions horizontally in view of the vertical etching direction towards the bottom layer side 5.

The second trench 9 obtained with this method step is then wider than the width of the first trench 3. During the forming steps of the second trench 9 by means of etching, the inner side walls 3*z* of the first trench 3 are protected from being etched away by means of the nitride spacer layer 8 formed previously. This ensures that the width A (see FIG. 3*j*) of the first trench 3 is not extended or enlarged during the steps of the second trench 9 being etched.

The etching process in the direction or towards the bottom layer side 5 removes material from the EPI layer (EPI) predominantly in the horizontal direction, causing a widening of the trench 9, extending the width B of the second trench 9, but also in the vertical direction. After the step of forming the second trench 9, the nitride spacer 8 and the oxide layer 6, previously applied in FIGS. 2*e* and 2*g*, are removed (see FIG. 3*j*). On the uncovered or exposed inner walls 3*z* and 9*z* of both the first trench 3 and the second trench 9 a layer of sacrificial oxide 10 is grown. This layer 10 reduces any etch defects and creates a smooth inner surface of both trenches. It also makes the inner trench walls suitable for sidewalls oxidation.

The sidewall or inner walls 3*z*-9*z* of the first trench 3 and the second trench 9 are oxidated in a next method step, preferably using a dielectric deposition technique. This step creates a liner oxide layer 11 for the source poly in at least the second trench 9 (FIG. 3*l*). The step depicted in FIG. 3*l* ends the forming steps of a trench and the structure thus formed in the epitaxial (EPI) layer is ready to be filed with source poly material.

The step of depositing source poly material 12 in the second trench 9 is pre-formed, as shown in FIG. 4*m*. The source poly 12 thus deposited extends from the second trench 9 well into the first trench 3. The part of the source poly 12 extending into the first trench 3 is to be etched away until the source poly 12 will not extend in the first trench 3 (see FIG. 4*n*).

The next method step according to the disclosure requires the cleaning of the inner side walls 3*z* of the first trench 3 by removal of any oxide layers (FIG. 4*o*) and the inter poly-oxide (IPO) formation by dielectric deposition or by thermal oxidation (see FIG. 4*p*). The part of the inter poly oxide (IPO) that covers the inner side wall 3*z* of the first trench needs to be removed resulting in clean side walls 3*z* of the first trench 3 (see FIG. 4*q*). As a next step of the method, gate oxidation (GOX) on the sidewalls 3*z* of the first trench 3 is provided (shown in FIG. 4*r*).

After the performing of gate oxidation, the gate poly 13 is formed by deposition of poly similarly to the depositing of the source poly in FIGS. 3*l* and 4*m*. Likewise, any excessive part of the poly that extends from the first trench 3 is to be etched back, as shown in FIG. 5*t*.

As a final step of the method according to the disclosure, a P-body implant 14 and source implant and contacts are formed, thus forming a semiconductor device 1. According to a first example of the method according to the disclosure the etching of a second trench 9 is executed in a vertical direction and in a horizontal direction, so that the second trench 9 has a width B larger than the width A of the first trench 3 and a second trench depth b larger than the first trench depth a. Moreover, the liner oxide layer is thicker than gate oxide layer GOX. Preferably a ratio between the first trench width A and the second trench width B is in range from 1:1.7 to 1:2.

In the alternative example, in the step 3*i*) anisotropic etching (e.g. ion etching or dry etching) is applied or in combination with isotropic etching. According to the example of the disclosure oxidation of the first trench 3 and the second trench 9 and deposition of oxide may require thermal annealing steps.

The disclosure also relates to a trench-gate semiconductor device as shown in FIG. 1, comprising a trench divided to a first trench 3 and a second trench 9 and wherein the source poly 12 is arranged in the second trench 9 and a gate poly (GOX) is arranged in the first trench 3 and separated from the source poly 12 by an inter poly oxide layer (IPO). The width of the second trench is larger than the width of the first trench and the depth (height) of the second trench is larger than the depth (height) of the first trench and the liner oxide layer is thicker than the gate oxide layer. The ratio between the first trench width A and the second trench width B is in range from 1:1.7 to 1:2.

In the alternative example, the ratio between the width D of the source poly 12 and the width C of the gate poly 13 is in the range from 0.7:1 to 1.2:1. Also the depth/height c of the gate poly 13 is arranged in the first (top) trench 3 is smaller than the depth/height d of the source poly 12 arranged in the second (bottom) trench 9.

LIST OF REFERENCE NUMERALS USED

1 semiconductor device
2 first opening
3 first trench
3*a* bottom of first trench
3*z* inner wall of first trench
4 top layer side
5 bottom layer side
6 oxide layer
7 nitride 8 nitride spacer
9 second trench
9*z* inner wall of second trench
10 sacrificial oxide
11 liner oxide layer
12 source poly
13 gate poly
14 P-body implant
EPI epitaxial layer
HDM hard mask
IPO inter poly oxide
GOX gate oxide layer
a first trench depth/height
b second trench depth/height
A first trench width
B second trench width
c gate poly depth/height

What is claimed is:

1. A method for manufacturing a trench-gate semiconductor device, the method comprising the steps of:
 - a) providing a single epitaxial (EPI), layer having a top layer side and a bottom layer side with a substrate having a seal layer on the top layer side that is structured to prevent auto doping from a doped substrate region;
 - b) growing a hard mask (HDM) layer on the top layer side of the EPI layer;
 - c) forming a first opening in the HDM;
 - d) dry etching a first trench from the top layer side towards the bottom layer side of the EPI layer in a vertical direction;
 - e) forming an oxide layer on the first trench walls;
 - f) depositing a nitride layer on the oxide layer on the at least first trench walls and on the HDM layer;
 - g) forming a nitride spacer from nitride;
 - h) dielectric etching of a bottom of the first trench to expose the EPI layer of the first trench;
 - i) etching a second trench from the bottom side of the first trench towards the bottom layer side of the EPI layer in a vertical direction and in a horizontal direction within the EPI layer;
 - j) removal of the nitride spacer and the oxide layer;
 - k) sacrificial oxide growth on sidewalls of the first trench and/or the second trench to reduce the etch defects;
 - l) oxidizing and/or dielectric deposition of the first trench and the second trench sidewall to create a liner oxide layer for the source poly in at least the second trench;
 - m) source poly deposition in at least the second trench;
 - n) etching the source poly until the source poly will not extend over the second trench;
 - o) cleaning the first trench side walls by removal of any oxide layers;
 - p) inter poly oxide (IPO), formation by dielectric deposition or by thermal oxidation;
 - q) cleaning the first trench side wall;
 - r) gate oxidizing (GOX), on the sidewalls of the first trench;
 - s) forming gate poly by deposition of poly;
 - t) etching back the poly; and
 - u) forming a P-body implant and a source implant and contacts, wherein the etching is executed in a vertical direction and in a horizontal direction in step h), so that the second trench is wider than the first trench and the second trench depth is larger than the first trench depth and the liner oxide layer is thicker than gate oxide layer.

2. The method according to claim 1, wherein anisotropic etching is applied in step i).

3. The method according to claim 1, wherein anisotropic etching is applied in combination with isotropic etching in step i).

4. The method according to claim 1, wherein depositing the nitride layer in step f) comprises depositing silicon nitride and/or forming a nitride spacer in step g) comprises depositing silicon nitride.

5. The method according to claim 1, wherein step i) or n) further comprises using a reactive ion etch process.

6. The method according to claim 1, wherein formulation of the nitride spacer in step g) comprises dry etching the nitride layer of the bottom part of the first trench.

7. The method according to claim 6, wherein the etching is anisotropic.

8. The method according to claim 1, wherein oxide etch is applied in step g).

9. The method according to claim 1, wherein step I) further comprises oxidation of the first trench and second trench and/or deposition oxide or deposition of oxide with thermal annealing.

10. The method according to claim 1, wherein any step from a) to u) further comprises a thermal annealing step.

11. The method according to claim 1, wherein step h) is carried out until the first trench width to the second trench width ratio is in a range from 1:1.7 to 1:2.

12. The method according to claim 2, wherein anisotropic etching is applied in combination with isotropic etching in step i).

13. The method according to claim 2, wherein depositing the nitride layer in step f) comprises depositing silicon nitride, and/or wherein forming a nitride spacer in step g) comprises depositing silicon nitride.

14. The method according to claim 2, wherein step i) or n) further comprises using a reactive ion etch process.

15. The method according to claim 2, wherein formulation of the nitride spacer in step g) comprises dry etching the nitride layer of the bottom part of the first trench.

16. A trench-gate semiconductor device comprising a trench that when seen in a vertical direction from a top layer side towards a bottom layer side of a single epitaxial (EPI) layer, is divided into a first trench having a depth formed from the top layer side towards a first trench bottom and a second trench having a depth formed from the first trench bottom towards the bottom layer side, further comprising a source poly arranged in the second trench and a gate poly arranged in the first trench and separated from the source poly by a inter poly oxide layer, wherein the second trench has a width that is larger than the width of the first trench and the depth of the second trench is larger than the depth of the first trench;
 - wherein the first trench comprises inner side walls and a gate oxide layer formed on the inner side walls of the first trench,
 - wherein the second trench comprises inner side walls and a liner oxide layer formed on the second trench inner walls,
 - wherein the first trench inner side walls and second trench inner side walls each comprise a smooth inner surface formed by a sacrificial oxide, and
 - wherein the liner oxide layer is thicker than the gate oxide layer.

17. The trench-gate semiconductor device according to claim 16, wherein the first trench width to the second trench width ratio is in a range from 1:1.7 to 1:2.

18. The trench-gate semiconductor device according to claim 16, wherein source poly width to gate poly width ratio is in a range from 0.7:1 to 1.2:1.

* * * * *